(12) United States Patent
Maeda

(10) Patent No.: US 9,502,588 B2
(45) Date of Patent: Nov. 22, 2016

(54) SOLAR CELL MODULE

(71) Applicant: SANYO Electric Co., Ltd., Moriguchi-shi, Osaka (JP)

(72) Inventor: Masanori Maeda, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/602,754

(22) Filed: Jan. 22, 2015

(65) Prior Publication Data

US 2015/0129015 A1    May 14, 2015

Related U.S. Application Data

(63) Continuation of application No. PCT/JP2012/069496, filed on Jul. 31, 2012.

(51) Int. Cl.
| H01L 31/0216 | (2014.01) |
| H01L 31/054 | (2014.01) |
| H01L 31/0475 | (2014.01) |
| H01L 31/056 | (2014.01) |
| H01L 31/0232 | (2014.01) |
| H02S 40/22 | (2014.01) |

(52) U.S. Cl.
CPC ... *H01L 31/02168* (2013.01); *H01L 31/02327* (2013.01); *H01L 31/0475* (2014.12); *H01L 31/056* (2014.12); *H01L 31/0547* (2014.12); *H02S 40/22* (2014.12); *Y02E 10/52* (2013.01)

(58) Field of Classification Search
CPC ............. H01L 31/02168; H01L 31/0475; H01L 31/02327; H01L 31/056; H01L 31/0547

USPC ........................................................ 136/256
See application file for complete search history.

(56) References Cited

U.S. PATENT DOCUMENTS 4,321,417 A    3/1982 Kurth et al.

FOREIGN PATENT DOCUMENTS

| GB | 2024511 A | 6/1979 |
| JP | 06177412 A | 6/1994 |
| JP | 2006036874 A | 2/2006 |
| JP | 2006073707 A | 3/2006 |
| JP | 2006286789 A | 10/2006 |
| JP | 2007-335853 | * 12/2007 |
| JP | 200733583 A | 12/2007 |
| JP | 2010287688 A | 12/2010 |
| JP | 2011216804 A | 10/2011 |

OTHER PUBLICATIONS

International Search Report corresponding to Application No. PCT/JP2012/069496; Date of Mailing: Aug. 28, 2012; with English translation.
Extended European Search Report corresponding to Application No. 12882267.3-1504/2881996 PCT/JP2012/069496; Date of Mailing: Jul. 31, 2015.

\* cited by examiner

*Primary Examiner* — Jayne Mershon
(74) *Attorney, Agent, or Firm* — Cantor Colburn LLP

(57) ABSTRACT

A solar cell module comprises a solar cell and sealing material provided on the rear surface side of the solar cell. The sealing material includes a colored layer that reflects light from the light-receiving surface side of the solar cell, and a transparent layer that is provided between the colored layer and the solar cell. The transparent layer has, in a space between adjacent solar cells, a side surface raised along the rear surface-side corner portion of the solar cell.

2 Claims, 3 Drawing Sheets

SOLAR CELL MODULE

This application is a continuation under 35 U.S.C. §120 of PCT/JP2012/069496, filed Jul. 31, 2012, which is incorporated herein reference.

TECHNICAL FIELD

The present invention relates to a solar cell module having sealing material.

BACKGROUND ART

A solar cell module has a structure for the purpose of improving the environment resistance of a solar cell in which the light-receiving surface side and the rear surface side of a solar cell have sealing materials, respectively, and the outer side thereof has a protection member.

For example, Patent Document 1 discloses that, in order to increase a solar cell power generation efficiency, the rear surface side of a solar cell element has thereon, as sealing material, white sealing material including a white colorant; this is used to reflect sunlight, and reflected light is allowed to enter the rear surface side of the solar cell element.

Patent Document 2 discloses a prior art in which the rear surface member side selectively has a reflection member that reflects light to correspond to a region between adjacent solar cells. According to Patent Document 2, the structure of this prior art is disadvantageous in that an end of a solar cell and an end of a reflection member must be accurately positioned and even a slight dislocation therebetween causes a failure to effectively use a light reflection member. Furthermore, light entering a surface member at a shallow angle in an inclined manner does not collide with the reflection member and directly passes through the rear surface member. Thus, Patent Document 2 suggests a calculating formula to optimize the distance between a solar cell and a reflection layer.

CITATION LIST

Patent Literature

Patent Document 1: Japanese Patent Laid-Open No. 2006-36874
Patent Document 2: Japanese Patent Laid-Open No. 2006-286789

TECHNICAL PROBLEM

When sealing material uses a colored layer, the reflection of the colored layer is used to allow the light entering a side surface of a solar cell to contribute to the rear surface-side power generation.

SUMMARY OF INVENTION

A solar cell module according to the present invention includes a solar cell, and sealing material provided on the rear surface side of the solar cell. The sealing material includes a colored layer that reflects light from the light-receiving surface side of the solar cell, and a transparent layer that is provided between the colored layer and the solar cell. The transparent layer has, in a space between adjacent solar cells, a side surface raised along the rear surface-side corner portion of the solar cell.

ADVANTAGEOUS EFFECT OF INVENTION

Light entering the side surface of a solar cell can be guided to the rear surface side of the solar cell, thereby contributing to the rear surface power generation.

DESCRIPTION OF EMBODIMENT

Figure 1:
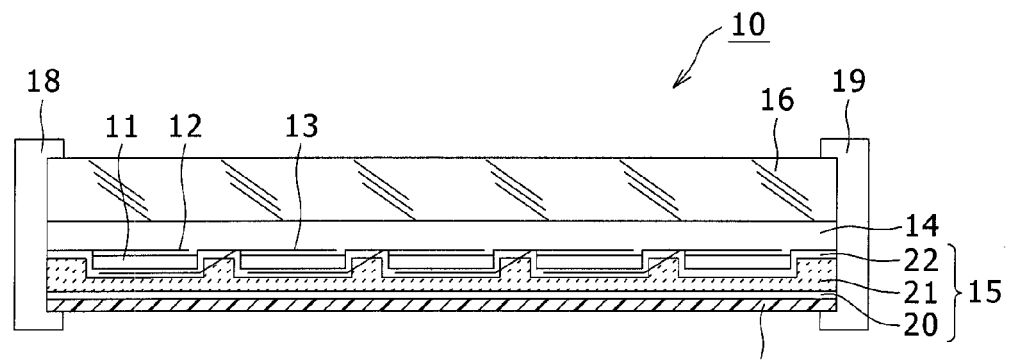
FIG. 1 illustrates the configuration of a solar cell module in an embodiment of the present invention.

The following section will describe an embodiment of the present invention in detail with reference to the drawings. The following material, thickness, and size, for example, are illustrative for description and can be appropriately changed depending on the specification of a solar cell module. In the following description, identical or similar elements in all drawings are denoted with the same reference numerals and will not be further described.

FIG. 1 illustrates the structure of a solar cell module 10. The solar cell module 10 is formed by a solar cell 11. The solar cell 11 has a light-receiving surface and a rear surface. The light-receiving surface functions as a principal surface into which light from the exterior of the solar cell 11 enters. The rear surface is a surface opposite the light-receiving surface. In FIG. 1, the upper side of the paper is assumed to be a light-receiving surface side and the lower side is assumed to be a rear surface side.

The solar cell module 10 is configured so that a plurality of solar cells 11 mutually serially connected using a plurality of wiring materials 12 and 13 are sandwiched between sealing material 14 at the light-receiving surface side and sealing material 15 at the rear surface side. The outer side thereof has a protection member 16 at the light-receiving surface side and a protection member 17 at the rear surface side. Ends are fixed by frames 18 and 19.

The solar cell 11 includes a photoelectric conversion unit that receives light such as sunlight to generate hole and electron photogenerated carriers. The photoelectric conversion unit has, for example, a substrate of semiconductor material (e.g., crystalline silicon (c-Si), gallium arsenide (GaAs), or indium phosphide (lnP)). The photoelectric conversion unit has, in a broad sense, a pn junction structure. For example, a hetero junction of an n-type monocrystal silicon substrate and amorphous silicon can be used. In this case, the substrate of the light-receiving surface side has thereon a layered structure of an i-type amorphous silicon layer, a p-type amorphous silicon layer doped with boron (B), for example, and a transparent conducting film (TCO) composed of translucent conducting indium oxide ($In_2O_3$). The rear surface side of the substrate has a layered structure of an i-type amorphous silicon layer and an n-type amorphous silicon layer doped with phosphorus (P), for example.

The photoelectric conversion unit may have structures other than the above one, so long as a function to convert light such as sunlight to electricity is achieved. For example, there may be used a structure that includes a p-type polycrystalline silicon substrate, an n-type diffusion layer formed at the light-receiving surface side, and an aluminum metal film formed at the rear surface side.

Each of the wiring materials 12 and 13 is a conductive member that is connected via an adhesive agent to a surface of a transparent conducting film on the photoelectric conversion unit. Each of the wiring materials 12 and 13 is provided as a thin plate composed of metal conductive material such as copper. The thin plate may be substituted with a twisted wire-like member. The conductive material may include, as an alternative to copper, silver, aluminium, nickel, tin, gold, or an alloy thereof.

The adhesive agent may be thermosetting resin adhesive agent composed of acrylic, flexible polyurethane, or epoxy. The adhesive agent includes conductive particles. Conductive particles may be nickel, silver, gold-plated nickel, or tin-plated copper, for example. The adhesive agent also may be insulating resin adhesive agent. In this case, any one or both of mutually-opposing faces of the wiring materials 12 and 13 or the connection electrode is/are allowed to have a convexoconcave shape so that resin can be appropriately excluded from between the wiring materials 12 and 13 and the connection electrode to thereby secure an electric connection.

Each of the sealing material 14 at the light-receiving surface side and the sealing material 15 at the rear surface side is a sheet-like member that functions as an impact buffer to the solar cell 11 and that functions to prevent the intrusion of foreign materials or water. These sealing materials 14 and 15 are selected in consideration of heat resistance, adhesiveness, flexibility, formability, and durability, for example. The sealing material 14 at the light-receiving surface side is preferably composed, in order to introduce exterior light, of transparent sealing material that is highly transparent and that allows incident light to pass therethrough without being absorbed or reflected. For example, polyethylene-base olefin resin or ethylene-vinyl acetate (EVA) maybe used. In addition, EEA, PVB, silicone-base resin, urethane-base resin, acrylic-base resin, or epoxy-base resin may also be used.

The sealing material 15 at the rear surface side may be the same material as the sealing material 14 at the light-receiving surface side. The sealing material 15 at the rear surface side in this embodiment is sealing material having a layered structure configured so that light from the light-receiving surface side of the solar cell 11 can be introduced to the rear surface side of the solar cell 11. Specifically, the sealing material 15 of the rear surface side has a layered structure in which three layers of a transparent layer 20, a colored layer 21, and a transparent layer 22 are arranged in this order from the protection member 17 of the rear surface side to the solar cell 11. The transparent layers 20 and 22 can be made of the same material as the sealing material 14 of the light-receiving surface side. The transparent layers 20 and 22 can be classified by naming the former a rear surface protection member-side transparent layer 20 and the latter a solar cell-side transparent layer 22.

The colored layer 21 can be prepared by mixing transparent sealing material with colored material. Transparent sealing material used as a base may be EVA, for example, and can be white-colored by, for example, using inorganic colorant (e.g., titanium oxide or zinc oxide) as colored material. A transparent base layer such as EVA has a refractive index of about 1.49 to 1.50 and titanium oxide has a refractive index of about 2.5. The colored layer 21 is mixed with titanium oxide at a mass ratio of about 1 to 5%, preferably 3%. This allows the colored layer 21 to have a higher light refractive index than the transparent layers 20 and 21 and to function as a reflection layer. Appropriate inorganic colorant other than the white one may also be used to provide the colored layer 21 having a color other than white.

The sealing material 15 of the rear surface side is configured so that the colored layer 21 having the largest thickness is sandwiched between the transparent layers 20 and 22 having a small thickness. The colored layer 21 may illustratively have a thickness of about 300-400 μm and the transparent layers 20 and 22 may illustratively have a thickness of about 100 μm.

The protection member 16 of the light-receiving surface side is a transparent plate or film that can introduce exterior light. The light-receiving surface-side protection member 16 may be a translucent member such as a glass plate, a resin plate, or a resin film. The rear surface-side protection member 17 can be the same as the light-receiving surface-side protection member 16. In the case where the solar cell module 10 has a structure in which there is no need to receive light from the light rear surface side, the rear surface-side protection member 17 can be a non-transparent plate or film. For example, a layered film can be used such as a resin film including therein an aluminum foil.

Figure 2:
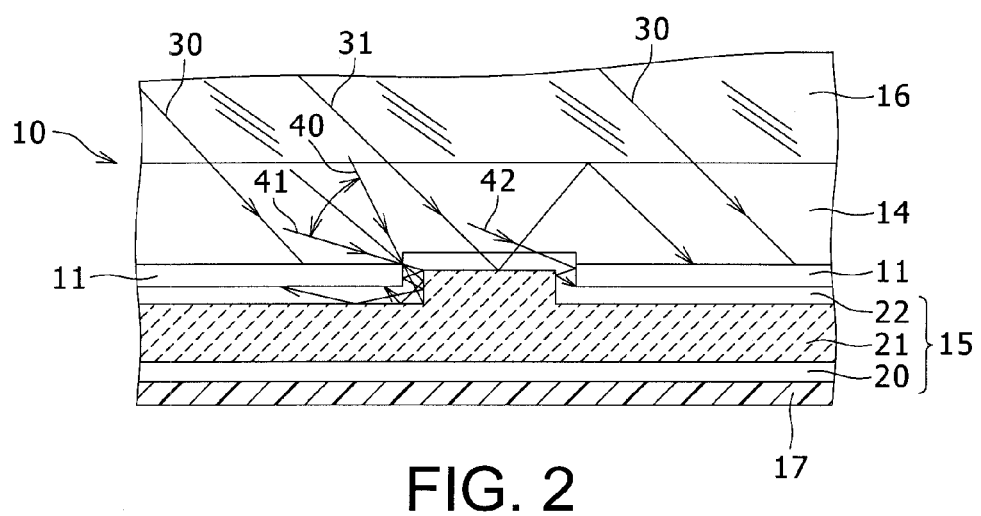
FIG. 2 is an expanded view of FIG. 1.

FIG. 2 is an expanded view illustrating a space sandwiched between the adjacent solar cells 11, in order to explain the function of the sealing material 15 of the rear surface side as a reflection layer. A region of a part of the space sandwiched between the adjacent solar cells 11 has the wiring material 13 connecting the adjacent solar cells 11. However, in order to show the light path, FIG. 2 omits the illustration of a region not including the wiring material 13.

FIG. 2 shows that the space provided at the center is sandwiched between the adjacent solar cells 11 provided in a symmetric manner. The space sandwiched between the adjacent solar cells 11 has the colored layer 21. The colored layer 21 protrudes to the light-receiving surface side in relation to the rear surface of the solar cell 11 but does not protrude to a position of the light-receiving surface of the solar cell 11. Details of the setting of the surface position of the colored layer 21 will be described later.

FIG. 2 illustrates the light paths of some light rays entering the solar cell module 10. The light paths are illustrated as running from the upper-left side to the lower-right side of the paper. The two solar cells 11 are symmetrically provided at the left and right sides in the paper. Thus, light moving from the upper right side to the lower left side of the paper with regard to the right side solar cell 11 of FIG.

2 can be considered to have an action symmetric to the action of light moving from the upper left side to the lower right.

In FIG. 2, a light ray 30 entering the light-receiving surface of the solar cell 11 is light that is absorbed by the light-receiving surface of the solar cell 11 without being influenced by the sealing material 15 of the rear surface side to thereby contribute to power generation. A part of a light ray 31 entering the space between the adjacent solar cells 11 passes through the transparent layer 22, is reflected by the surface of the colored layer 21, and is reflected by an interface between the light-receiving surface-side sealing material 14 and the light-receiving surface-side protection member 16 and moves again to the rear surface side and enters the light-receiving surface of the solar cell 11. As described above, the incident light from the light-receiving surface side enters, whether by direct incidence or indirect incidence, the light-receiving surface of the solar cell 11, except for light entering the transparent layer 22.

Meanwhile, the colored layer 21 has a higher refractive index than the transparent layers 20 and 22. Thus, of the light ray 31 entering the space between the adjacent solar cells 11, light entering the transparent layer 22 sandwiched between the solar cell 11 and the colored layer 21 is reflected by the interface between the transparent layer 22 and the colored layer 21 and moves to the side surface and the rear surface of the solar cell 11. The side surface of the solar cell 11 also has a higher refractive index than the transparent layer 22. Thus, light not absorbed by the solar cell 11 is reflected by the interface between the transparent layer 22 and the solar cell 11 toward the colored layer 21. Specifically, the light having entered the transparent layer 22 sandwiched between the solar cell 11 and the colored layer 21 is reflected between the colored layer 21 and the solar cell 11 and moves to the side surface and the rear surface of the solar cell 11. As described above, the transparent layer 22 sandwiched between the solar cell 11 and the colored layer 21 functions as a light-guiding path that guides the incident light from the light-receiving surface of the solar cell 11 to the side surface and the rear surface of the solar cell 11.

Light enters the transparent layer 22 and is reflected by the side surface of the colored layer 21 and subsequently enters the rear surface of the solar cell 11. Light enters the side surface of the solar cell 11. This light contributes to the power generation at the rear surface side of the solar cell 11. In FIG. 2, among light rays 40, 41, and 42 entering the transparent layer 22, the light ray 40 and 41 have a light path in which the light rays 40 and 41 having entered the transparent layer 22 are firstly reflected by the side surface of the colored layer 21 and subsequently move to the side surface and the rear surface of the solar cell 11. The light ray 42 has a light path in which the light ray 42 having entered the transparent layer 22 is firstly reflected by the side surface of the solar cell 11 and is subsequently reflected by the side surface of the colored layer 21 to move to the side surface and the rear surface of the solar cell 11.

These light rays 40, 41, and 42 contribute to the power generation at the light-receiving surface side of the solar cell 11 if there is no transparent layer 22 or colored layer 21. The transparent layer 22 sandwiched between the solar cell 11 and the colored layer 21 provides a function of a light-guiding layer, contributing to the power generation at the rear surface side of the solar cell 11.

The surface position of the colored layer 21 has a strong relation with the level of contribution to the power generation at the rear surface side of the solar cell 11 by light having entered the transparent layer 22. With reference to FIG. 3 to FIG. 8, the following section will describe the relation between the surface position of the colored layer 21 and the power generation at the rear surface side. Each of these drawings is a view obtained by further expanding FIG. 2 in which the position of a pn junction 23 in the solar cell 11 is shown as a reference.

Figure 3:
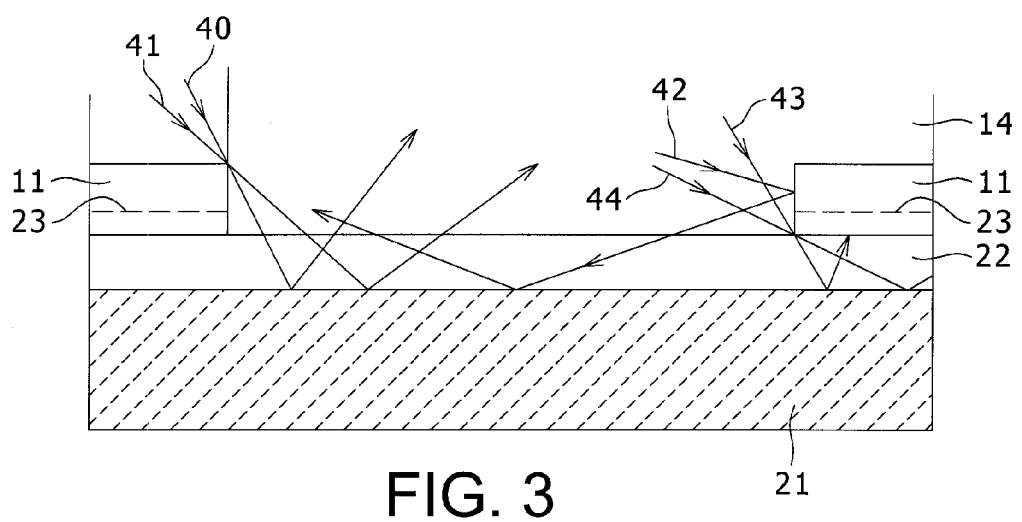
FIG. 3 illustrates a light path of incident light when a colored layer in the embodiment of the present invention has a surface position provided at the rear surface side of the solar cell and is flat.

FIG. 3 shows a case in which transparent layer 22 does not protrude from the position of the rear surface of the solar cell 11 in the space sandwiched between the adjacent solar cells 11 and the transparent layer 22 and the colored layer 21 are flat. The light rays 40, 41, and 42 are light having the same incidence angles as those of the light rays 40, 41, and 42 of FIG. 2. In contrast with FIG. 2, a region sandwiched between the adjacent solar cells 11 does not include therein the side surface of the colored layer 21. Thus, the light rays are merely reflected by the surface of the colored layer 21 without being reflected by the side surface of the colored layer 21. These light rays are again reflected by the interface between the light-receiving-side sealing material 14 and the light-receiving surface-side protection member 16 and enter the light-receiving surface of the solar cell 11. Light rays 43 and 44 enter the transparent layer 22 and are then reflected not by the side surface of the colored layer 21 but by the surface and then enter the rear surface of the solar cell 11. In FIG. 3, the light rays 43 and 44 contribute to the power generation at the rear surface side of the solar cell 11 and are not light rays reflected by the side surface of the colored layer 21.

Figure 4:
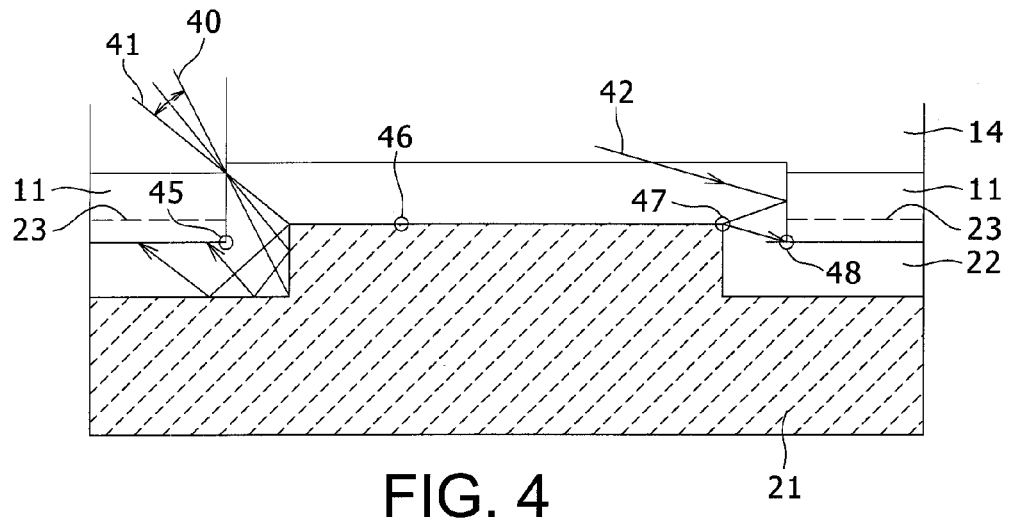
FIG. 4 illustrates the light path of the incident light when the colored layer in the embodiment of the present invention has a surface position provided at a pn junction of the solar cell.

FIG. 4 illustrates the transparent layer 22 and the colored layer 21 arranged so as to have a side surface raised along a corner portion 45 of the rear surface side of the solar cell 11 in the rear surface side of the solar cell 11. In this drawing, the transparent layer 22 and the colored layer 21 surround the periphery of the corner portion 45. A surface position 46 of the colored layer 21 is closer to the light-receiving surface side than to the rear surface of the solar cell 11. As a reference, the surface position 46 of the colored layer 21 is shown at the same position as that of the pn junction 23. This is an example in which the surface position 46 of the colored layer 21 extends over the rear surface of the solar cell 11 and does not have to have the same position as that of the pn junction 23. In this case, the space sandwiched between the adjacent solar cells 11 includes the transparent layer 22 and the colored layer 21 protruding from the position of the rear surface of the solar cell 11 to the light-receiving surface side.

In FIG. 4, the light rays 40 and 41 have a similar light path as described in FIG. 2 in which the light rays 40 and 41 enter the transparent layer 22 and are firstly reflected by the side surface of the colored layer 21 and then enter the rear face side of the solar cell 11. The light ray 40 has a light path in which the light from an end of the light-receiving surface of the solar cell 11 enters the transparent layer 22 and then moves to a raised corner portion of the colored layer 21. The light ray 41 is light that moves from an end of the light-receiving surface of the solar cell 11 to enter the transparent layer 22 and moves to the raised corner portion of the colored layer 21. The light ray 41 has a light path in which the light ray 41 is reflected by the raised corner portion of the colored layer 21 and is subsequently reflected by the surface of the colored layer 21 at the rear surface side of the solar cell 11 and moves to the rear surface of the solar cell 11.

Light enters the transparent layer 22 and is firstly reflected by the side surface of the colored layer 21 and then enters the rear surface side of the solar cell 11. Light having this type of light path will be called "colored layer first reflected light." In the case of FIG. 4, the "colored layer first reflected light" contributing to the power generation at the rear surface side is light having an incidence angle in a range from the incidence angle of the light ray 40 to the incidence angle of the light ray 41. The light ray 40 has an incidence angle that extends from the end of the light-receiving surface of the solar cell 11 to the raised corner portion of the colored layer 21. The light ray 41 has an incidence angle that extends from the end of the light-receiving surface of the solar cell 11 to the raised corner portion of the colored layer 21.

The light ray 42 similarly moves as described in FIG. 2. Specifically, the light ray 42 has a light path in which the light ray 42 enters the transparent layer 22 and is reflected by the side surface of the solar cell 11 and collides with the corner portion 47 of the raised corner portion of the colored layer 21 and then enters the corner portion 48 of the rear surface of the solar cell 11.

Light has a light path in which the light enters the transparent layer 22 and is firstly reflected by the side surface of the solar cell 11 and is subsequently reflected by the side surface of the colored layer 21 and then enters the side surface of the solar cell 11. Light having this type of light path will be called "colored layer second reflected light." Then, the "colored layer second reflected light" is generated only when the corner portion 47 of the raised corner portion of the colored layer 21 (i.e., the surface position of the colored layer 21) is closer to the light-receiving surface side than to the rear surface position of the solar cell 11. The light ray 42 of FIG. 4 corresponds to the "colored layer second reflected light" at the boundary thereof.

Figure 5:
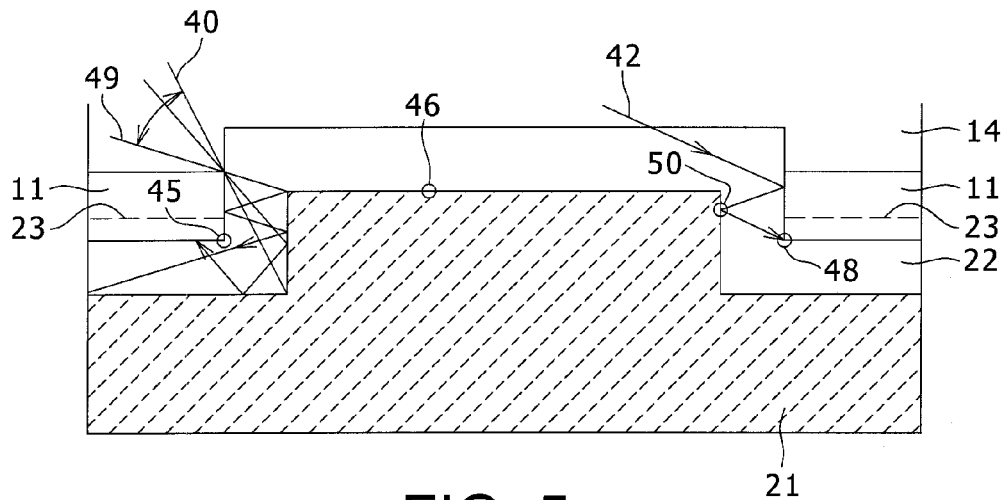
FIG. 5 illustrates the light path of the incident light when the colored layer in the embodiment of the present invention has a surface position provided between the pn junction of the solar cell and the position of the light-receiving surface of the solar cell.

FIG. 5 illustrates that the surface position 46 of the colored layer 21 is closer to the light-receiving surface of the solar cell 11 than in the case of FIG. 4 but does not extend over the position of the light-receiving surface of the solar cell 11. In FIG. 4, the surface position 46 of the colored layer 21 is provided at the pn junction 23. Thus, the surface position 46 of the colored layer 21 of FIG. 5 is at a light-receiving surface side in relation to the pn junction 23.

A light ray 49 is light as in the light 41 of FIG. 4 that enters the transparent layer 22 from the end of the light-receiving surface of the solar cell 11 and moves to the corner portion at the top of the colored layer 21. The corner portion at the top of the colored layer 21 is positioned at the surface position 46 of the colored layer 21. Thus, the light ray 49 moving from the end of the light-receiving surface of the solar cell 11 to the corner portion at the top of the colored layer 21 has such an incidence angle that is more parallel to the light-receiving surface of the solar cell 11 than in the case of the light 41 of FIG. 4. The "colored layer first reflected light," which contributes to the rear surface-side power generation, is light in FIG. 4 having an incidence angle in a range from the incidence angle of the light ray 40 to the incidence angle of the light ray 41. However, the "colored layer first reflected light" in the case of FIG. 5 is light having an incidence angle in a range from the incidence angle of the light ray 40 to the incidence angle of the light ray 49. Thus, when compared with FIG. 4, FIG. 5 provides increased light functioning as the "colored layer first reflected light."

The light ray 42 enters the side surface of the solar cell 11 at the same position as in the light ray 42 of FIG. 4. The position 50 at which the light reflected by the side surface of the solar cell 11 collides with the side surface of the colored layer 21 is provided at the rear surface side in relation to the corner portion 47 of the raised corner portion of the colored layer 21. The "colored layer second reflected light," which contributes to the rear surface-side power generation, is light provided at the rear surface side in relation to the corner portion 47 of the raised corner portion of the colored layer 21. In FIG. 4, the light ray 42 is provided at the boundary. In FIG. 5, light having an incidence angle at a vertical side in relation to the light ray 42 is reflected by the side surface of the solar cell 11 and collides with the corner portion 47 of the raised corner portion of the colored layer 21. This provides proportionally-increased light functioning as the "colored layer second reflected light."

Figure 6:
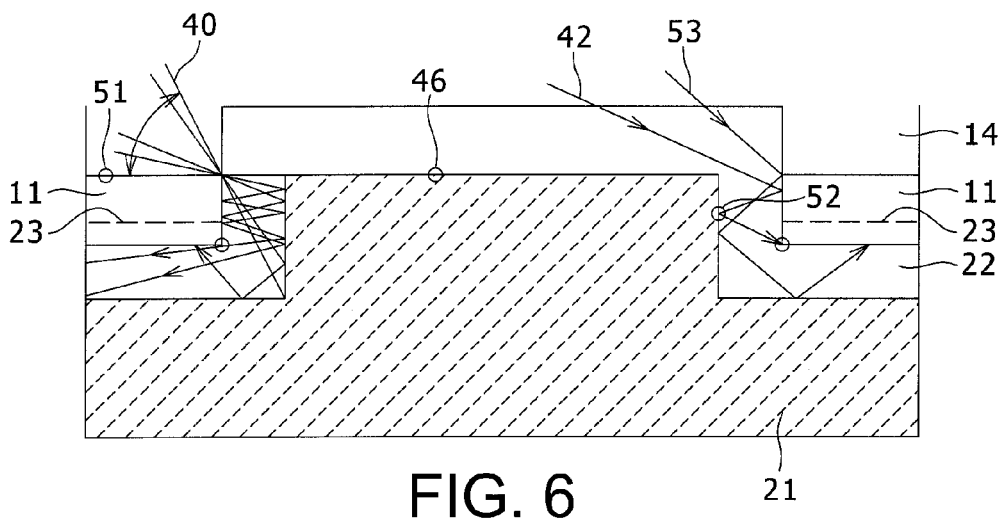
FIG. 6 illustrates the light path of the incident light when the colored layer in the embodiment of the present invention has a surface position provided at the light-receiving surface of the solar cell.

FIG. 6 shows that the surface position 46 of the colored layer 21 is positioned at the light-receiving surface of the solar cell 11. A light ray 51, which has a light path in which the light ray 51 from the end of the light-receiving surface of the solar cell 11 enters the transparent layer 22 and is reflected by the corner portion at the top of the corner portion at the top of the colored layer 21, is light extending along the surface of the light-receiving surface of the solar cell 11. Thus, in FIG. 6, the "colored layer first reflected light" contributing to the rear surface-side power generation is light having an incidence angle in a range from the incidence angle of the light ray 40 to the incidence angle of the light ray 51. Thus, when compared with FIG. 5, light functioning as the "colored layer first reflected light" is further increased to the extreme limit.

The light ray 42 is the same as the light ray 42 of FIG. 4 and FIG. 5 but is different in that the position 52 at which the light reflected by the side surface of the solar cell 11 collides with the side surface of the colored layer 21 is further closer to the rear surface side than the corner portion 47 of the raised corner portion of the colored layer 21. This provides a proportionally-increased light functioning as the "colored layer second reflected light." A light ray 53 is an example of light having a light path in which light enters and is reflected by the end of the light-receiving surface of the solar cell 11 and collides with a side wall of the colored layer 21 and is further reflected to move to the rear surface of the solar cell 11 and shows a previous step of the light ray 53 at the boundary of the contribution to the rear surface power generation in FIG. 7 shown below.

Figure 7:
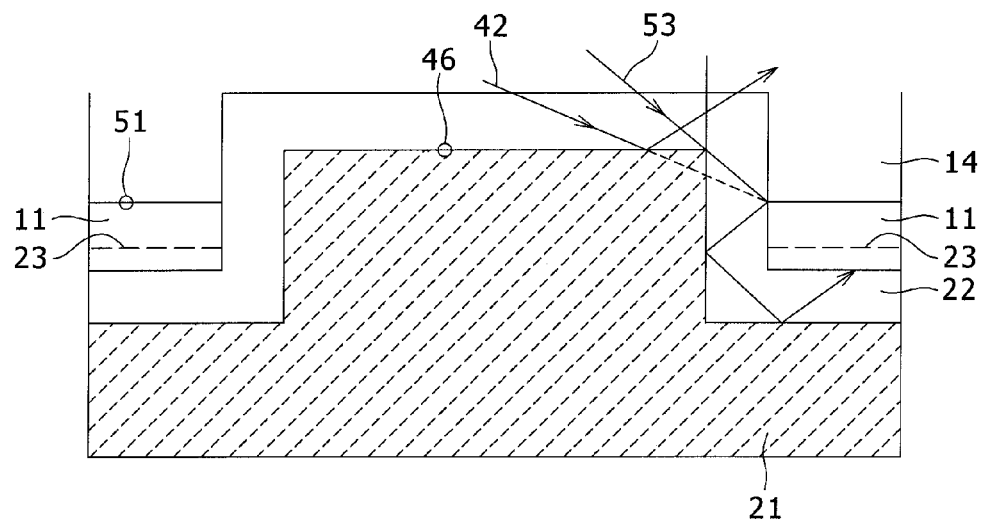
FIG. 7 illustrates the light path of the incident light when the colored layer in the embodiment of the present invention has a surface position protruding to the protection member side of the light-receiving surface side in relation to the position of light-receiving surface of the solar cell.

FIG. 7 illustrates the surface position 46 of the colored layer 21 extends over the position of the light-receiving surface of the solar cell 11 and is provided at the light-receiving surface-side protection member 16. Since the increase of the "colored layer first reflected light" is already at the extreme limit in FIG. 6, no further illustration is provided therein. In the case of the "colored layer second reflected light," light entering the side surface of the solar cell 11 is limited as compared with FIG. 6. The light ray 42 is the same as the light ray 42 of FIG. 5 but is different in that the surface position 46 of the colored layer 21 extends over the position of the light-receiving surface of the solar cell 11 and thus the light is undesirably reflected by the surface of the colored layer 21 and fails to enter the side surface of the solar cell 11. The light ray 53 is light that enters the end of the light-receiving surface of the solar cell 11 from the raised corner portion at the top of the colored layer 21 and is at the boundary of the "colored layer second reflected light." In FIG. 6, the light path of the light ray 53 is directly shown. However, the light ray 53 in FIG. 6 has a sufficient margin to the boundary of the "colored layer second reflected light."

Figure 8:
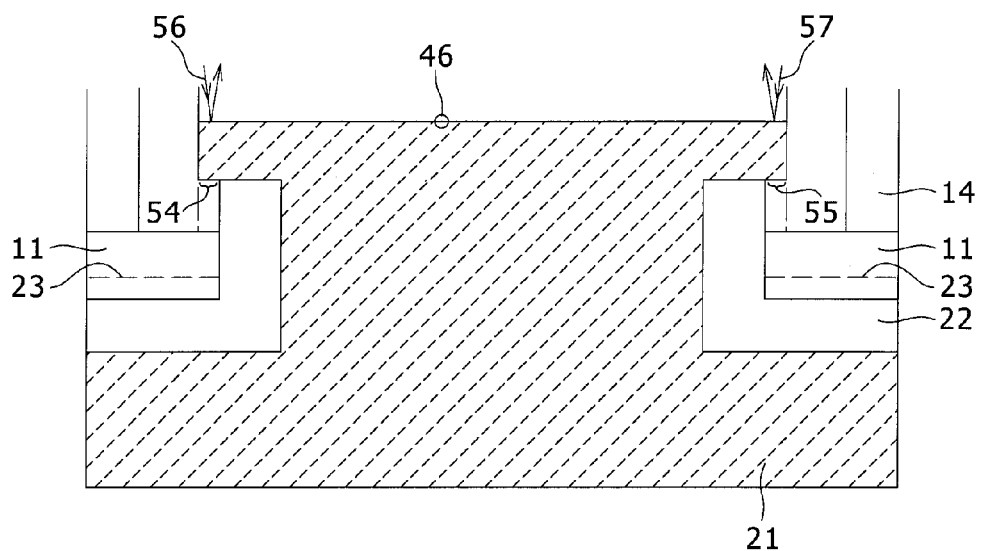
FIG. 8 illustrates the light path of the incident light when the colored layer in the embodiment of the present invention protrudes to an end of the light-receiving surface of the solar cell.

FIG. 8 shows that the surface position 46 of the colored layer is further closer to the light-receiving surface-side protection member 16 and has protrusions 54 and 55 covering a part of the end of the light-receiving surface of the solar cell 11. When the colored layer 21 has the protrusions 54 and 55 as described above, light rays 56 and 57 having entered the protrusions 54 and 55 are undesirably reflected by the colored layer 21, thus causing a reduction in the effective power generation area at the light-receiving surface of the solar cell 11 side.

Until the protrusions 54 and 55 are generated, the "colored layer second reflected light" may be limited as shown in FIG. 7. However, the existence of the transparent layer 22 prevents the light-receiving surface of the solar cell 11 side from having a reduced effective power generation area.

As described above, the surface position of the colored layer 21 is closer to the light-receiving surface side than to the position of the rear surface side of the solar cell 11 and is closer to the rear surface side than to the position of the light-receiving surface of the solar cell 11. This configuration allows light having entered the transparent layer 22 to efficiently contribute to the power generation at the rear surface side of the solar cell 11. The surface position of the colored layer 21 can be set by providing the light-receiving surface-side sealing material 14 and the rear surface-side sealing material 15 to adjust the pressure when it is sandwiched between the light-receiving surface-side protection member 16 and the rear surface-side protection member 17.

REFERENCE SIGNS LIST

10 Solar cell module
11 Solar cell
12 and 13 Wiring material
14 (Light receiving surface-side) sealing material
15 Sealing material
16 (Light receiving surface-side) protection member
17 (Rear surface-side) protection member
18 and 19 Frame
20 and 22 Transparent layer
21 Colored layer
23 Pn junction
30, 31, 40, 41, 42, 43, 44, 49, 51, 53, 56, and 57 Light ray
45, 47, and 48 Corner portion
46 Surface position of (colored layer)
50 and 52 Position
54 and 55 Protrusion

The invention claimed is:

1. A solar cell module, comprising:
a solar cell and sealing material provided on a rear surface side of the solar cell,
wherein:
the sealing material comprises:
a colored layer that reflects light from a light-receiving surface side of the solar cell, and
a transparent layer that is provided between the colored layer and the solar cell in a direction perpendicular to a rear surface of the solar cell, and
wherein the colored layer has portions that are each protruding in a direction from the rear surface side of the solar cell toward the light-receiving surface side of the solar cell in a space between adjacent solar cells; and
the protruding portion of the colored layer comprises a side surface opposite to the side surface of the solar cell and a surface closer to the light-receiving surface side of the solar cell than to the rear surface side of the solar cell.

2. The solar cell module according to claim 1, wherein: the colored layer has, in the space between adjacent solar cells, a surface closer to the rear surface side position than to the light-receiving surface side of the solar cell.

* * * * *